(12) United States Patent
Hotzel

(10) Patent No.: US 9,075,934 B2
(45) Date of Patent: Jul. 7, 2015

(54) RETICLE DEFECT CORRECTION BY SECOND EXPOSURE

(71) Applicant: Arthur Hotzel, Dresden (DE)

(72) Inventor: Arthur Hotzel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 50 days.

(21) Appl. No.: 13/799,165

(22) Filed: Mar. 13, 2013

(65) Prior Publication Data

US 2013/0198697 A1 Aug. 1, 2013

Related U.S. Application Data

(63) Continuation-in-part of application No. 13/244,426, filed on Sep. 24, 2011, now Pat. No. 8,785,112.

(51) Int. Cl.
*G03F 7/20* (2006.01)
*G06F 17/50* (2006.01)
*G03F 1/24* (2012.01)
*G03F 1/72* (2012.01)
*G03F 1/84* (2012.01)

(52) U.S. Cl.
CPC ...... *G06F 17/50* (2013.01); *G03F 1/24* (2013.01); *G03F 1/72* (2013.01); *G03F 1/84* (2013.01); *G03F 7/70283* (2013.01); *G03F 7/7045* (2013.01); *G03F 7/70466* (2013.01); *G03F 7/7065* (2013.01); *Y02T 10/82* (2013.01)

(58) Field of Classification Search
CPC ............... G03F 1/72; G03F 1/24; G03F 1/84; G03F 17/50; G03F 7/7045; G03F 7/70283; G03F 7/70466; G03F 7/7065; G03F 1/22
USPC .................................. 430/5, 311, 30; 716/51
See application file for complete search history.

(56) References Cited

U.S. PATENT DOCUMENTS 5,795,685 A * 8/1998 Liebmann et al. ................ 430/5

* cited by examiner

*Primary Examiner* — Brittany Raymond
(74) *Attorney, Agent, or Firm* — Ditthavong & Steiner, P.C.

(57) ABSTRACT

Correction of reticle defects, including reticle weak spots or shortcomings, is accomplished with a second exposure. Embodiments include obtaining a reticle with a pattern corresponding to a wafer pattern design, exposing a wafer with the reticle, modifying the design, designating variations between the design and the modified design as reticle defects, and exposing the wafer with correction patterns containing structure corresponding to the modified design at defect positions. Other embodiments include modifying, eliminating, and/or shifting the pattern near a reticle blank defect position, and exposing a wafer with the reticle and with a correction pattern containing structure corresponding to the design at a defect position; modifying a patterned reticle surface layer near a defect forming an expanded defect, exposing a wafer with the modified reticle and with an expanded defect correction pattern; and exposing a wafer with a reticle and with a correction pattern larger than a detected reticle defect.

16 Claims, 15 Drawing Sheets

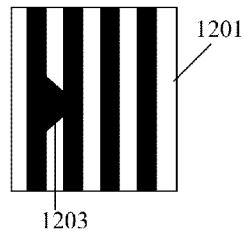
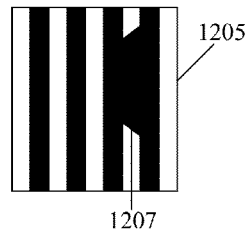
FIG. 12A    FIG. 12B
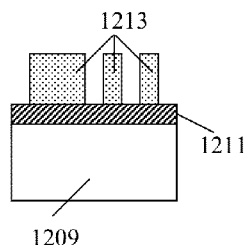
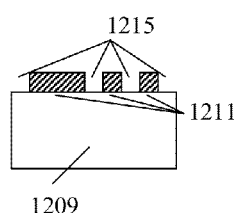
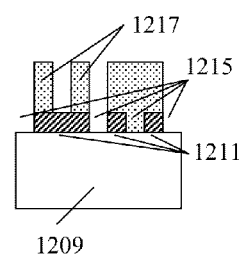
FIG. 12C    FIG. 12D    FIG. 12E
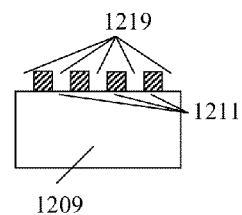
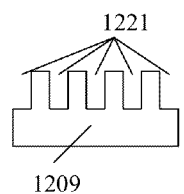
FIG. 12F    FIG. 12G

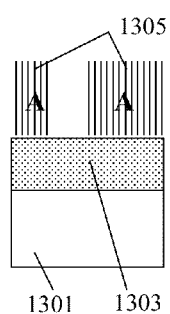
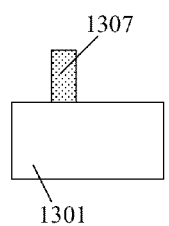
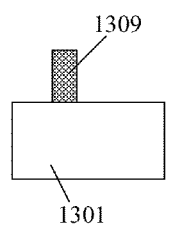
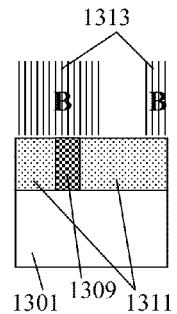
FIG. 13A  FIG. 13B  FIG. 13C  FIG. 13D
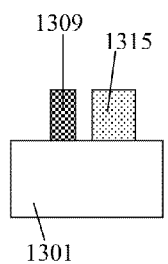
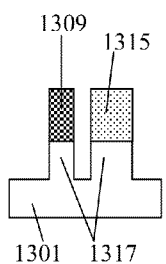
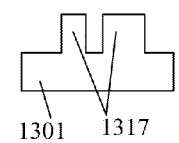
FIG. 13E  FIG. 13F  FIG. 13G

RETICLE DEFECT CORRECTION BY SECOND EXPOSURE

CROSS-REFERENCE TO RELATED APPLICATION

The present application is a continuation-in-part of U.S. application Ser. No. 13/244,426, filed on Sep. 24, 2011, the entire contents of which are herein incorporated by reference.

TECHNICAL FIELD

The present disclosure relates to corrections of reticle defects or design or OPC weak spots by a second exposure. The present disclosure is particularly applicable to extreme ultraviolet (EUV) reticles, for semiconductor devices in 28 nanometer (nm) and 20 nm technology nodes and beyond.

BACKGROUND

A lithographic photomask, or reticle, is conventionally used for patterning wafers. Reticle defects at critical points in the design may lead to a total chip yield loss. This issue is particularly severe for EUV technology where defect-free reticles are difficult to obtain, as will be explained below. An EUV reticle is formed from an EUV blank, which includes a reflective multilayer dielectric stack (for example, fifty alternating layers) on a non-transmissive (to EUV radiation) substrate. Due to the complex build, it is currently impossible to manufacture EUV blanks that are entirely free of defects. Blank induced EUV reticle defects are often irreparable, but may be avoided by shifting the reticle pattern with respect to the blank to move the blank defects into a non-critical design region. However, this method only works if the design and blank defect map are favorably matched, and if the blank defects are detected prior to manufacturing the reticle. In addition, non-blank induced defects in an EUV reticle cannot be corrected in this manner. Finding blanks that are suitable for a given design takes time and increases cost for the reticles.

Some EUV reticle defects (but only a minority of blank-induced defects) may be repaired. For conventional transmissive reticles, defect repair is often possible, but if the defects are only detected after completion of the manufacturing process, the repair requires in most cases the removal of the pellicle (a thin organic membrane on a metal frame that is glued to the front surface, or active side, of the reticle), which takes time and may damage the reticle. Alternatively, all reticle defects may be corrected by writing a replacement reticle. However, writing a new reticle is expensive and adds significant time to the setup time for a product, as no wafers may be printed while the new reticle is being produced. Further, a new reticle must be qualified again (i.e., checked again for errors), thereby adding more time to the setup time, and may include as many or more defects than the original reticle. For EUV, the new reticle will suffer from the same issue of inherent blank defectivity as the original reticle. The reliable supply of defect-free EUV reticles is at present an unsolved problem for the industry.

Weak spots may also be present in the design or be caused by optical proximity correction (OPC) and may have the same effect as reticle defects. Such detected weak spots may in some cases be corrected in a reticle repair process, but more often require a design re-spin and the writing of a replacement reticle, both of which are costly and time consuming.

In other cases, the need for design modifications, e.g. the addition of contacts, may arise after manufacturing of the reticle. As in the case of design weak spots, such modifications may occasionally be realized by reticle repair processes, but usually require the writing of a replacement reticle. The absence of the required design modifications in the manufactured reticle will be referred to as "design shortcomings" in the following.

A need therefore exists for methodology enabling reticle defect, design weak spot or OPC weak spot correction, or design modifications, to obtain a defect-free pattern with the correct design on a wafer, without the need for a replacement reticle.

SUMMARY

An aspect of the present disclosure is a method of correcting variations between a printed pattern on a wafer according to a design and a pattern of a modified design by a second exposure of the wafer using a correction pattern.

Another aspect of the present disclosure is a method of preconditioning a reticle manufactured with a blank having a blank defect, or having a defect, design or OPC weak spot, or design shortcoming, to facilitate the correction of the defect, weak spot, or shortcoming by application of a second exposure to a wafer exposed with the reticle, the preconditioning containing one or several of the following: (i) shifting the design pattern with respect to the reticle blank having a blank defect; (ii) modifying the pattern written onto the reticle in a region around a blank defect, e.g. by leaving an area containing the blank defect free of pattern; (iii) modifying the pattern in a region around a reticle defect, e.g. by applying an absorbing deposit over an area containing the defect.

An additional aspect of the present disclosure is a method of exposing a wafer with a patterned reticle having a defect, design or OPC weak spot, or design shortcoming, and with a correction pattern that is larger than the defect, weak spot and/or shortcoming.

A further aspect of the present disclosure is a method of correcting a reticle defect, design or OPC weak spot, or design shortcoming by exposing a wafer with the reticle, applying a second exposure to the wafer, and applying additional processing steps to the wafer, such that the exposure with the reticle, the second exposure, and the additional processing steps together correspond to a double patterning process which can be described by a Boolean formula containing either the term (i) "OR(A,", or the term (ii) "OR(NOT(A)," in which A denotes the illumination by the exposure with the reticle, and the reticle defect, design or OPC weak spot, or design shortcoming is "dark" in case (i) and "clear" in case (ii).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: obtaining a reticle with a pattern corresponding to a design for a wafer pattern; exposing a wafer with the reticle; modifying the design; identifying variations between the design and the modified design; designating the variations as defects in the reticle; and exposing the wafer with one or more correction patterns, the correction patterns containing structure corresponding to the modified design at positions corresponding to positions of the defects.

Aspects of the present disclosure include the modified design including contacts not in the design. Further aspects include the modified design including connections or disconnections of lines not in the design. Further aspects include the modified design including dummy fill pattern not in the design. Other aspects include exposing the wafer with a correction pattern by exposing the wafer with an area of a correction reticle including primarily the correction pattern or a part of a repair kit being on a second reticle or an area of the reticle containing a correction pattern or a part of a repair kit on the reticle, the area containing the correction pattern or the repair kit being outside an area containing the pattern. An additional aspect includes exposing the wafer with a correction pattern by exposing the wafer with an e-beam or laser writer programmed with a pattern including the correction pattern. Another aspect includes the reticle being an EUV reticle.

Another aspect of the present disclosure is a method including: detecting a defect in a reticle blank; patterning the reticle blank with a pattern corresponding to a design for a wafer pattern, shifting the design pattern with respect to the blank defect and/or leaving free of pattern the area of the reticle blank corresponding to the defect and/or modifying the pattern with respect to the design at one or more positions near a position of the defect; exposing a wafer with the patterned reticle blank; and exposing the wafer with a correction pattern containing structure corresponding to the design at a position corresponding to the position of the defect.

Aspects include leaving free of pattern the area of the reticle blank corresponding to the defect by omitting, during patterning the reticle blank, a portion of the pattern corresponding to a location of the defect. Additional aspects include exposing the wafer with a correction pattern by exposing the wafer with an area of a correction reticle including primarily the correction pattern or a part of a repair kit being on a second reticle or an area of the reticle containing a correction pattern or the repair kit on the reticle, the area containing the correction pattern or the repair kit being outside an area containing the pattern. Other aspects include exposing the wafer with a correction pattern by exposing the wafer with an e-beam or laser writer programmed with a pattern including primarily the correction pattern. A further aspect includes the reticle blank being an EUV reticle blank.

Another aspect of the present disclosure is a method including: obtaining a reticle with a pattern corresponding to a design for a wafer pattern; detecting a defect, design or OPC weak spot, or design shortcoming on the reticle; modifying the surface layer on the reticle in a portion of the reticle adjacent to and/or containing the defect, weak spot, or design shortcoming, forming an expanded defect, weak spot, or design shortcoming; exposing a wafer with the reticle after modifying the surface layer; and exposing the wafer with a correction pattern for the expanded defect, weak spot, or design shortcoming.

Aspects include modifying the surface layer on the reticle by applying an absorbing deposit in the region of the defect, weak spot, or design shortcoming and/or adjacent regions. Further aspects include selecting a shape and size of the expanded defect, weak spot, or design shortcoming to facilitate the correction pattern. Other aspects include selecting a shape and size of the expanded defect, weak spot, or design shortcoming to increase overlay tolerance between exposing the wafer with the reticle and exposing the wafer with the correction pattern.

Another aspect of the present disclosure is a method including: obtaining a reticle with a pattern corresponding to a design for a wafer pattern; detecting a defect, design or OPC weak spot, or design shortcoming on the reticle; exposing a wafer with the reticle; and exposing the wafer with a correction pattern for the defect, weak spot, or shortcoming, the correction pattern being larger than the defect, weak spot, or shortcoming.

Aspects include the correction pattern being 3 nanometers (nm) to 50 nm larger than the defect, weak spot, or shortcoming. Other aspects include the correction pattern including an extended portion, the extended portion being narrower than the design pattern at the position corresponding to the extended portion. Further aspects include the correction pattern including a second pattern corresponding to the design for a wafer pattern or a pattern corresponding to the design for a wafer pattern with one or more modifications. An additional aspect includes modifying a dose of the exposure with the reticle and/or a dose of the exposure with the correction pattern and/or one or more sizes of parts of the pattern on the reticle during manufacturing of the reticle and/or one or more sizes of parts of the correction pattern to achieve, for an exposure with only the reticle or only the correction pattern, a mean pattern size on the wafer or critical dimension that differs from the target pattern size on the wafer to compensate for overlay errors between the exposure with the reticle and the exposure with the correction pattern.

Another aspect of the present disclosure is a method including: obtaining a reticle with a pattern corresponding to a design for a wafer pattern; detecting one or more defects, weak spots, or shortcomings on the reticle; modifying none, one, or more of the defects, weak spots, or shortcomings on the reticle; identifying the defects, weak spots, or shortcomings as clear or dark; exposing a wafer covered with a photoresist with the reticle; exposing the wafer covered with one or more different photoresists, before and/or after the exposure with the reticle, with one or more correction patterns for one or more of (i) the dark or (ii) the clear defects, weak spots, or shortcomings; applying one or more further processing steps to the wafer before, between, and/or after the exposure with the reticle and the exposure or exposures with the correction pattern or patterns, the processing sequence comprised of the exposures with the reticle and the correction pattern or patterns and the one or more further processing steps corresponding to a double patterning or multi-patterning process characterized by a Boolean formula containing the term (i) "OR(A," for dark defects or (ii) "OR(NOT(A)," for clear defects, in which A denotes the illumination of the wafer in the exposure with the reticle.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 12A and 12B schematically illustrate two reticles with the same design, each reticle having a defect but at different positions in the design, and FIGS. 12C through 12G schematically illustrate a wafer process containing illumination of a wafer with both reticles and additional steps corresponding to a double patterning process, leading to a defect free pattern on the wafer, in accordance with another exemplary embodiment; and FIGS. 13A through 13G schematically illustrate a double patterning scheme that can be used for correction of clear reticle defects, in accordance with another exemplary embodiment.

DETAILED DESCRIPTION

Figure 1A:
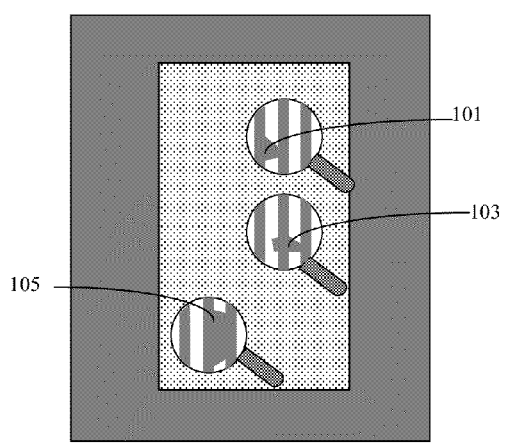
FIG. 1A through 1C schematically illustrate a reticle with defects, a correction reticle, and a defect-free resist pattern, respectively, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reticle defects and design and OPC weak spots and design modifications after manufacturing of a reticle attendant upon lithographic patterning of a wafer. In accordance with embodiments of the present disclosure, the wafer is exposed a second time using a correction reticle, a repair pattern on the original reticle, or a programmed e-beam or laser writer. The correction reticle may have a short write and inspection time and may be significantly less expensive than the original reticle. Likewise, a predefined repair kit written together with the original design to the same reticle does not add significant write and inspection time, and is less expensive than writing a new reticle.

Methodology in accordance with embodiments of the present disclosure includes obtaining a reticle with a pattern corresponding to a design for a wafer pattern, exposing a wafer with the reticle, modifying the design, identifying variations between the design and the modified design, designating the variations as defects in the reticle, and exposing the wafer with one or more correction patterns, the correction patterns containing structure corresponding to the modified design at positions corresponding to positions of the defects. Other methodology includes detecting a defect in a reticle blank, patterning the reticle blank with a pattern corresponding to a design for a wafer pattern, shifting the design pattern with respect to the blank defect and/or leaving free of pattern the area of the reticle blank corresponding to the defect and/or modifying the pattern with respect to the design at one or more positions near a position of the defect, exposing a wafer with the patterned reticle blank, and exposing the wafer with a correction pattern containing structure corresponding to the design at a position corresponding to the position of the defect.

Further methodology includes obtaining a reticle with a patterned surface layer containing a pattern corresponding to a design for a wafer pattern, detecting a defect, weak spot, or design shortcoming on the reticle, modifying the surface layer on the reticle in a portion of the reticle adjacent to and/or containing the defect, weak spot, or shortcoming, forming an expanded defect, weak spot, or design shortcoming, exposing a wafer with the reticle after modifying the surface layer, and exposing the wafer with a correction pattern for the expanded defect, weak spot, or design shortcoming. Still other methodology includes obtaining a reticle with a pattern corresponding to a design for a wafer pattern, detecting a defect, weak spot, or shortcoming on the reticle, exposing a wafer with the reticle, and exposing the wafer with a correction pattern for the defect, weak spot, or shortcoming, the correction pattern being larger than the defect, weak spot, or shortcoming.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

In the following, the term defect is to be understood as being modified by the words "and/or design or OPC weak spots and/or design shortcomings" where appropriate (this does not apply to the description of blank defects or reticle defects caused by blank defects). Areas on the reticle, and defects in particular, may be described as clear areas (defects), those that transmit or reflect light or EUV radiation, or dark areas (defects), which block light or EUV radiation. In particular, a dark defect on a reticle essentially leads to a lack of radiation reaching the resist-covered wafer at the corresponding position, thereby causing a deviation of the ensuing resist pattern on the wafer (after development) from the intended shape. In contrast, a clear defect essentially leads to an excess of radiation reaching the resist-covered wafer at the corresponding position, thereby causing an essentially opposite deviation. Clear defects on a reticle may be turned into dark defects in a repair process, e.g. by the application of an absorbing deposit covering an area containing the defect. Similarly, some dark defects can be turned into clear defects in a repair process, e.g. by removing the absorbing top layers from the reticle in an area containing the defect (this will not be an option for defects buried in the reflecting multilayer stack of an EUV reticle). Some defects may contain both "dark" and "clear" aspects, i.e. lead to a lack of radiation at some points on the wafer and an excess of radiation at other points. Also such defects may be turned into either dark or clear defects with a suitable repair process.

The most basic embodiments of the present disclosure can correct only dark defects and, therefore, can only be used for the correction of reticles which either only have dark defects after manufacturing, or in which all clear defects have been turned into dark defects. Unless otherwise stated, the exemplary embodiments shown in the illustrations address this case. However, as will be detailed below, some more complicated embodiments involving additional steps corresponding to a double or multi-patterning process address clear (not dark) defects, in which case the reticle must be brought to a state where it has only clear defects. When a reticle has design or OPC weak spots, they usually occur in several instances in the design, which in most cases are too numerous to repair or modify on the reticle; therefore, the application of the methods disclosed here to the correction of weak spots may require that all weak spots on the reticle belong to the "correctible" kind from the beginning, unless the number of instances of the "wrong" kind of weak spots on the reticle is less than approximately 100. Within this limitation, although correction of reticle defects will be described below, correction of design and OPC weak spots may be accomplished in a similar fashion. The same applies to design shortcomings. It is understood that usually only those defects or weak spots that may lead to unacceptable deviations of the wafer pattern from the target pattern (i.e., those which are said to be "out of spec"), and that cannot be sufficiently repaired by a "conventional" reticle repair process will be addressed by the methods contained in this disclosure. Finally, all descriptions apply to reflective reticles (like EUV reticles) as well as to conventional transmissive reticles. The term "opening" is used equally for a clear area on a transmissive or a reflective reticle.

Figure 1B:
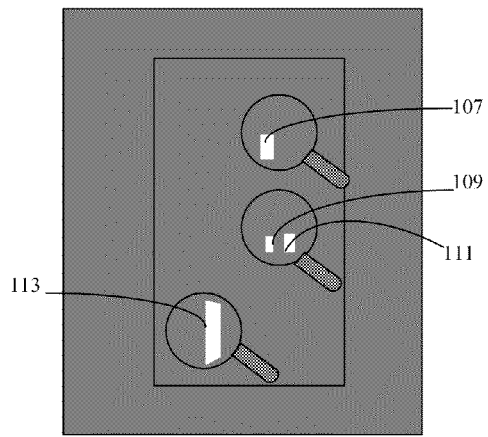
Figure 1C:
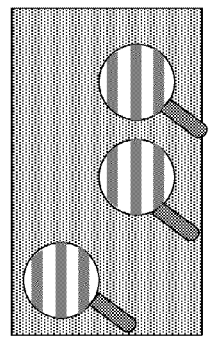

FIGS. 1A through 1C illustrate a reticle with defects, a correction reticle, and a defect-free resist pattern, respectively, in accordance with an exemplary embodiment. Adverting to FIG. 1A, a patterned reticle is illustrated as having three dark defects, 101, 103, and 105. If a wafer is exposed using the reticle of FIG. 1A, the portions that correspond to defects 101, 103, and 105 will not be exposed, and after development of the exposed resist layer, defects will be formed at the corresponding positions in the resist pattern.

Illustrated in FIG. 1B is a correction reticle, in accordance with an exemplary embodiment, which is primarily dark, with a clear pattern corresponding to the defects on the original reticle. Specifically, opening 107 corresponds to defect 101, openings 109 and 111 correspond to portions of defect 103, and opening 113 corresponds to defect 105. Note that the size and shape of the openings can differ from the size and shape of the respective dark defects to obtain the optimum result, or to facilitate manufacturing. Assist patterns, e.g. overlay marks, may be included in the original reticle and the correction reticle, similar to assist patterns employed for double patterning, to aid in aligning the correction reticle with the original reticle; other metrology structures may be included in the correction reticle to measure the critical dimension or size of the corresponding structures formed on the wafer after exposure and resist development. By exposing the wafer twice, once using the original reticle and a second time using the correction reticle, the combined exposures lead to a defect-free resist pattern, as illustrated in FIG. 1C. Although this embodiment requires the manufacturing of an additional correction reticle with similar precision requirements as those of the original reticle, it nevertheless offers clear benefits compared to a complete reticle re-write, since the correction reticle will contain an extremely small amount of patterned area. The write and inspection time required to make the correction reticle will therefore be very small. The same is true for the statistical risk of incurring defects in the few square micrometers of pattern on the correction reticle and, therefore, for the ensuing repair effort and risk of reticle yield loss. Most importantly for EUV, due to the low amount of patterned area on the correction reticle, blank defectivity will be a very minor issue here, allowing the use of lower-grade blanks. Therefore, the correction reticle will be cheaper than the original reticle and require shorter manufacturing time. Alternatively, if the original image field is small enough to leave sufficient room on the reticle (e.g., if it is placed in the upper half of the reticle only), the correction pattern might be formed on the same reticle (e.g., in the lower half) in a second reticle patterning step.

Figure 2:
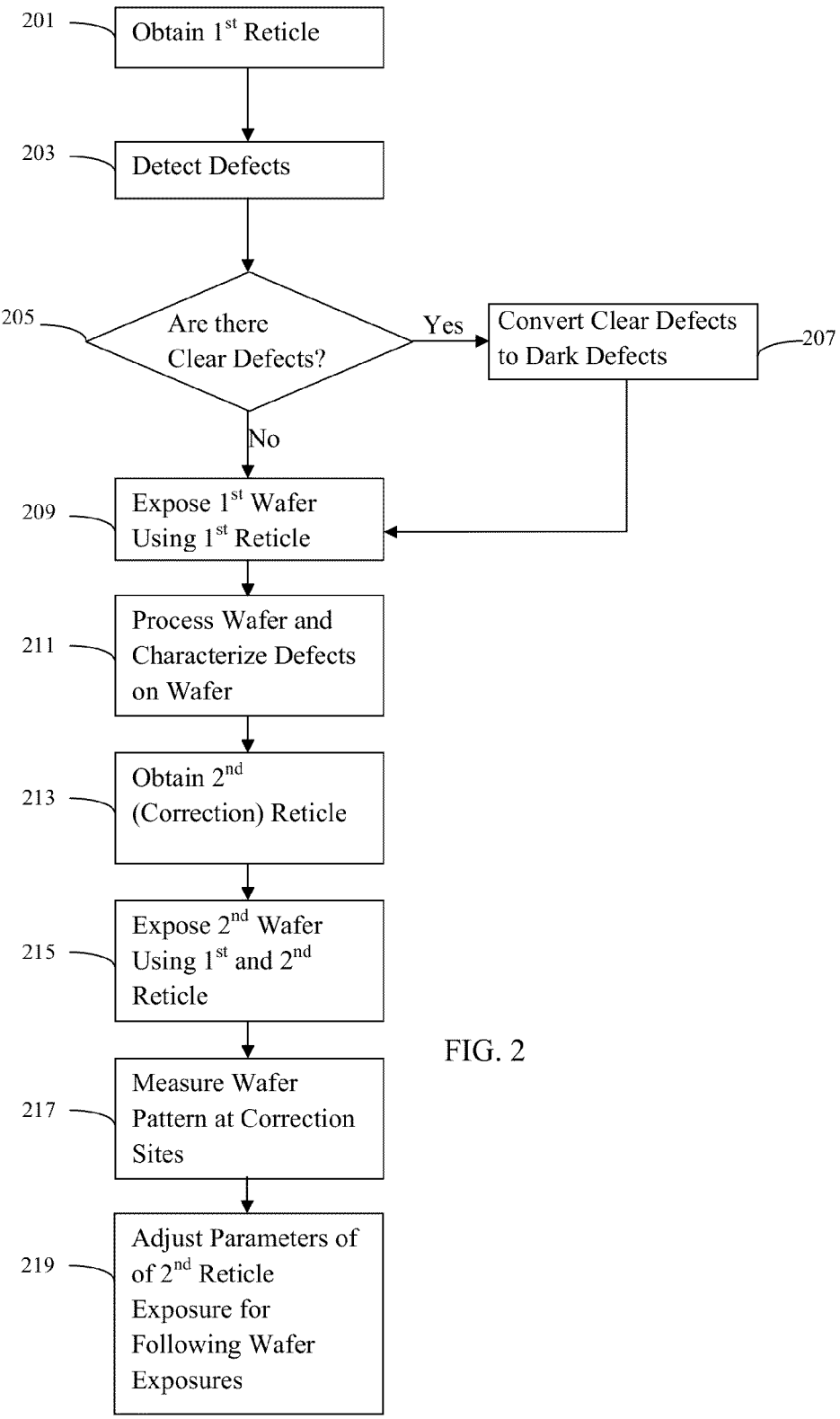
FIG. 2 shows a process flow for the exemplary embodiment associated with FIG. 1.

Adverting to FIG. 2, a process flow for the first exemplary embodiment is shown. As illustrated, a first reticle, such as that shown in FIG. 1A, is obtained in step 201, which can include the repair of some reparable defects; remaining out-of spec defects are detected on the reticle in step 203. The defects may be classified as dark defects and clear defects. A determination is made at step 205 as to whether the reticle includes any clear defects. Such clear defects are converted to dark defects (step 207), as described in more detail with respect to FIGS. 7A and 7B below. The remaining defects and any newly created dark defects may then be characterized. A resist covered wafer may then be exposed using the first reticle (step 209) and the defects may be characterized on the wafer (step 211). Optimum additional exposure conditions, such as aerial image, shape of repair pattern, dose, alignment, and focus may be determined, and a second, or correction, reticle, such as that shown in FIG. 1B, may be obtained (step 213). Another resist covered wafer is then exposed using the first reticle and additionally exposed a second time using the correction reticle (step 215). The exposure with the correction reticle can occur after or before the exposure with the first reticle. In further optimization, the resulting wafer pattern at the defect positions may be characterized (step 217), and the alignment and dose for the second exposure may be adjusted to achieve the best result in further wafer exposures (step 219). Overlay marks and metrology structures may be included in the correction reticle in step 213, and matching overlay marks and dark areas provided in the first reticle in step 201; the measurement of the corresponding structures formed on the wafer after exposure and resist development may be used to monitor and control the exposure with the correction reticle in the further wafer exposures following step 219. In accordance with this embodiment, a single design containing tailor-made repair patterns for all defects, at positions corresponding to the original design, is employed. The repair pattern may be optimized for actual defects and easily aligned with the defects, and only one additional exposure is required. Although the correction exposure may be done in the same chamber and with the same tool as the original exposure (e.g., an EUV tool), the correction exposure may take place in a less advanced tool, for example, a conventional exposure tool, and may employ conventional UV light, rather than using EUV in an EUV tool; in this case, the correction reticle would be a conventional reticle, too. Use of the less advanced tool has the advantage of reducing costs, whereas an EUV tool has superior resolution. Further, the second exposure may alternatively be performed prior to the first exposure.

Figure 3:
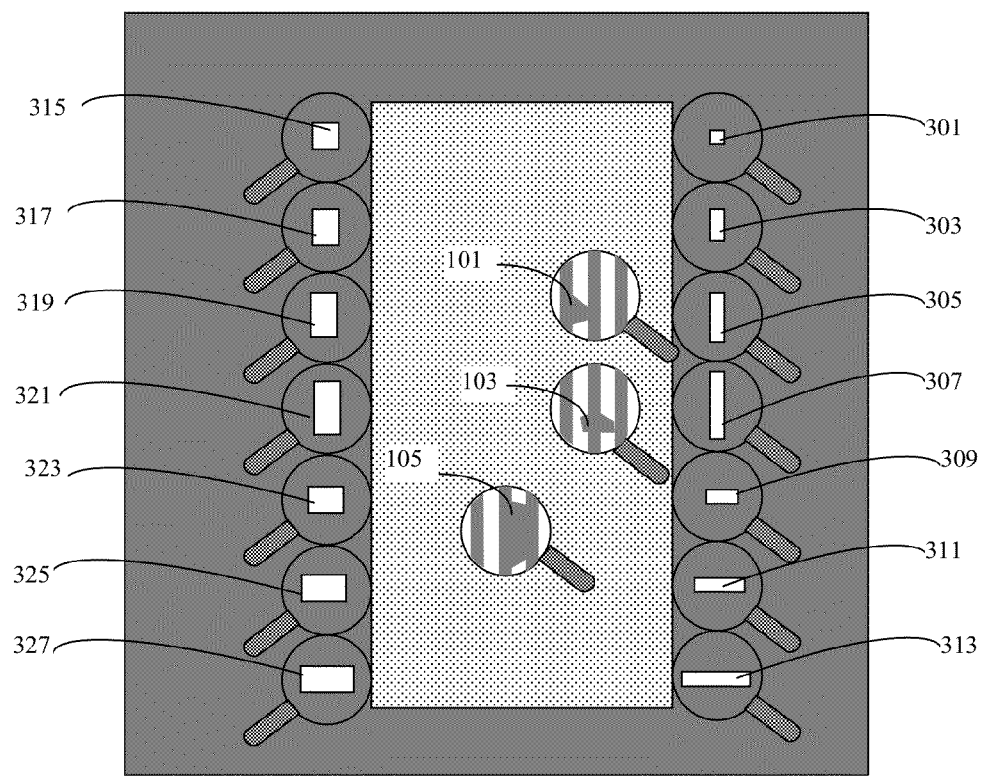
FIG. 3 schematically illustrates a reticle including a predefined repair kit in the margins, in accordance with another exemplary embodiment.

In accordance with another embodiment, instead of obtaining a separate correction reticle, a pre-defined repair kit may be included in the margins of the original reticle, as illustrated in FIG. 3. As shown, the reticle includes the same defects 101, 103, and 105 as in FIG. 1A, but also includes exemplary repair patterns 301 through 327. The repair patterns may be small standard clear polygons well separated from each other and from the main image fields. For each dark defect in the original design, the most appropriate repair pattern is selected, and an additional exposure is applied to the resist on the wafer. For example, for defect 101, repair pattern 303 is the closest match, whereas for defect 103, repair patterns 301 (for the left-most portion of the defect) and 303 (for the right-most portion of the defect) are optimal, and for defect 105, repair pattern 307 is the best match. Doses of additional exposures are optimized for the best repair results, and scanner reticle masking (REMA) blades are employed for narrowing the fields of additional exposures to selected repair patterns. Although not shown for illustrative convenience, the repair pattern on the original reticle may alternatively be tailor-made to correspond to the actual defects, and therefore be optimized for the actual defects. However, a second patterning step of the reticle would be required. In still another variant, a larger and more variable repair kit may be put on a separate reticle, potentially serving as a universal repair reticle for several production reticles. As in the exemplary embodiments described with reference to FIGS. 1 and 2, assist structures, as alignment marks, overlay marks, and metrology structures, may be added to the repair kit (especially if the kit is placed on a separate reticle), and corresponding structures may be added to the original design.

Figure 4:
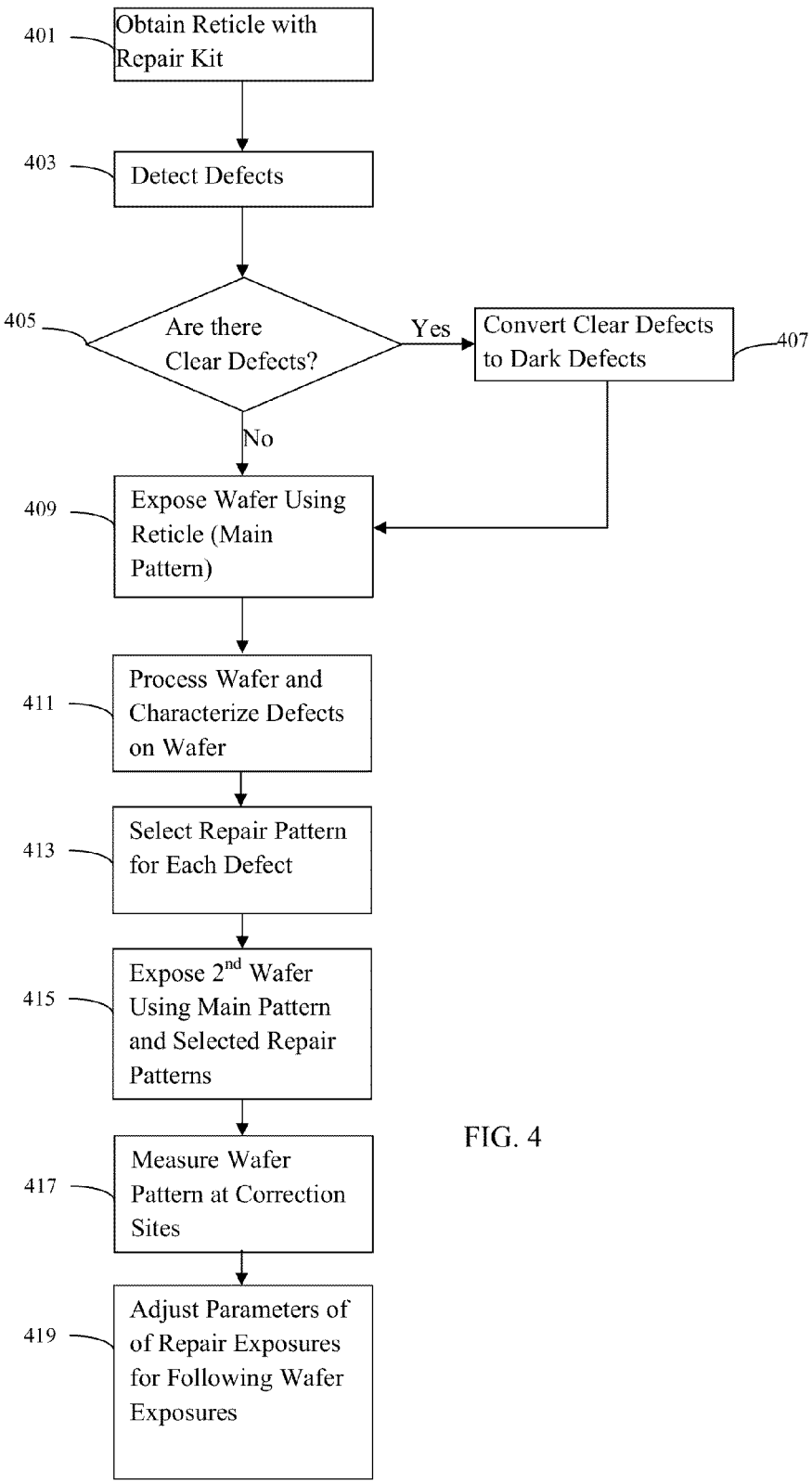
FIG. 4 shows a process flow for the exemplary embodiment associated with FIG. 3.

A process flow for the second exemplary embodiment is illustrated in FIG. 4. As shown, a reticle including both the original design to be printed and a predefined repair kit, as illustrated in FIG. 3, is obtained in step 401. According to step 403, defects are detected and characterized as dark defects or clear defects. If clear defects are detected at step 405, they are converted to dark defects (step 407). A resist covered wafer may then be exposed using the main pattern of the reticle at step 409, and the defects may be characterized on the wafer (step 411). Optimum additional exposure conditions, such as aerial image, shape of repair pattern, dose, alignment, and focus may be determined. For each defect, the most suitable repair pattern and exposure condition is then selected (step 413). Another resist covered wafer is then exposed using the main pattern and each of the selected repair patterns on the reticle (step 415). The exposure with the repair patterns can occur after the exposure with the main pattern, or the exposure with some or all of the repair patterns can occur before the exposure with the main pattern. Scanner reticle masking blades may be employed for narrowing the field of additional exposure to the selected repair pattern, and the reticle is re-aligned before each additional exposure. Upon reviewing the resulting wafer pattern at the repair sites (step 417), the parameters of the additional exposures may be readjusted for further wafer exposures (step 419). Overlay marks and metrology structures added to the original designs and the repair kit in step 401 and exposed together with and in addition to the original design and the selected repair patterns, respectively, may be used to monitor and control the exposure of the repair patterns in the exposure of further wafers following step 419. Since the repair kit is not specifically tailored to the design, correction of the defects will usually involve multiple exposures using the repair kit, each time aligning a repair pattern with a defect, while masking other patterns. This will likely limit the practicability of this method to cases where the number of defects in the original pattern is relatively small, i.e. smaller than approximately 10. Since design or OPC spots are usually more numerous than this when they occur, the applicability of this method will in most cases be limited to real defects. However, a pre-defined repair kit has the advantage of saving product setup time as no time is lost for writing a repair pattern after completion of the original pattern. Besides, if the repair kit is placed on the original reticle together with the design, it is not necessary to exchange reticles between the main and the additional exposures, which saves cycle time and might be beneficial for overlay stability. This embodiment is particularly well suited for contact and via reticles which include mostly clear squares, with a defect generally corresponding to a missing square.

Figure 5:
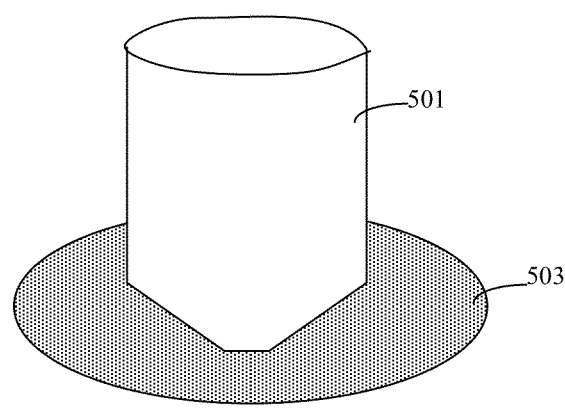
FIG. 5 schematically illustrates a programmable e-beam writer, in accordance with another exemplary embodiment.
Figure 6:
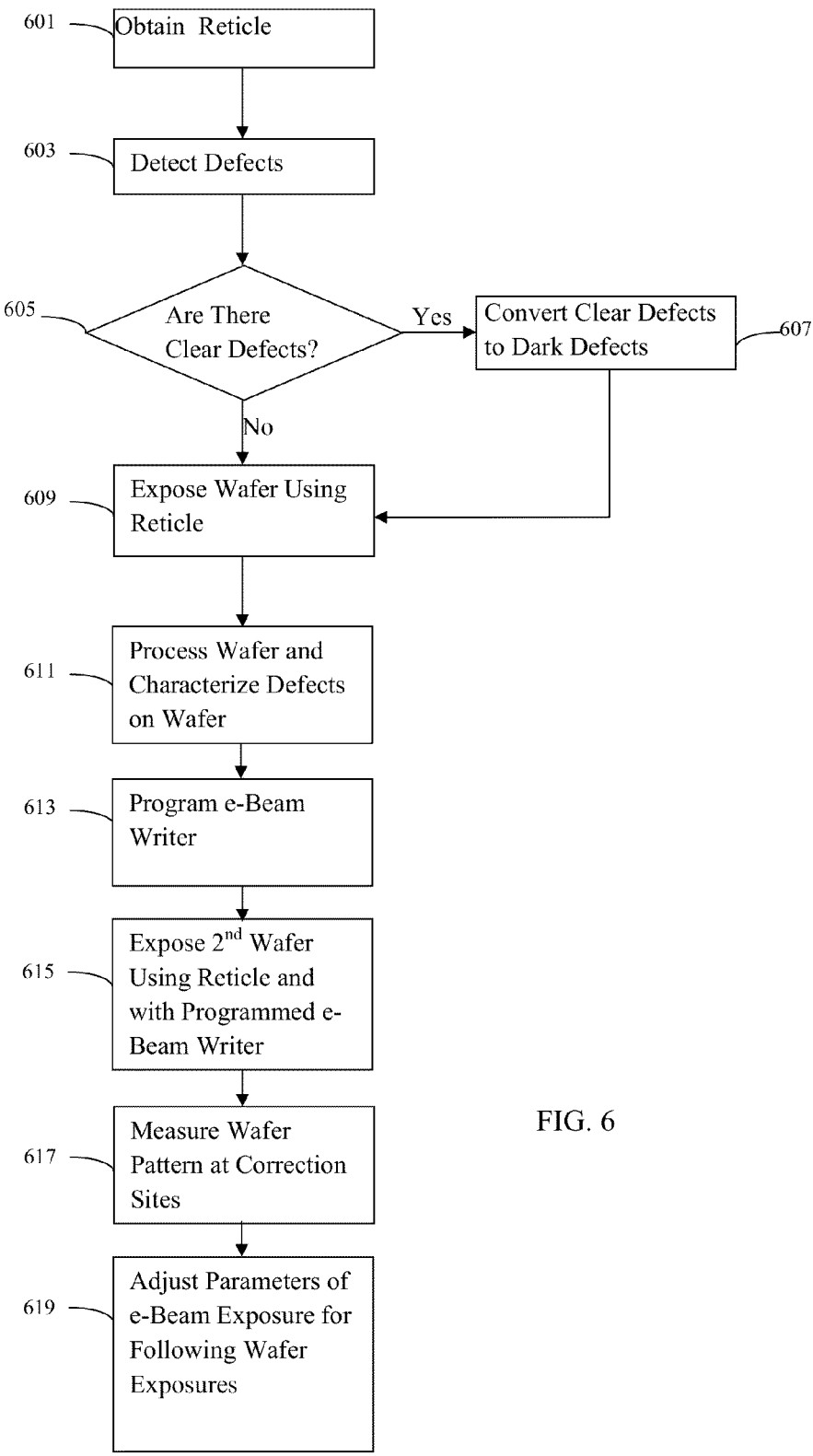
FIG. 6 shows a process flow for the exemplary embodiment associated with FIG. 5.

Adverting to FIG. 5, a programmable e-beam writer 501 is illustrated for directly writing a repair pattern on the resist covered wafer 503 at the defect positions to correct for reticle defectivity, in accordance with another embodiment. A process flow corresponding to the use of an e-beam writer is illustrated in FIG. 6. Adverting to FIG. 6, the process begins similar to the process flows of FIGS. 2 and 4, with a reticle being obtained at step 601, defects being detected at step 603, the presence of clear defects being determined at step 605, clear defects being converted to dark defects at step 607, a wafer being exposed using the reticle at step 609, and defects being characterized on the wafer at step 611. Once only dark defects remain, an e-beam writer is programmed to expose each image field of the wafer at the position of the defects with a suitable correction shape and dose (step 613) and another resist covered wafer is exposed using the reticle and additionally exposed by writing with the e-beam writer (step 615), which can happen after or before the exposure with the reticle. Within step 613, the e-beam writer may be programmed to write additional structures like overlay marks and metrology structures, and corresponding marks and dark areas may be provided in the reticle obtained in step 601. Finally, the resulting defect pattern at the repair sites may be reviewed (step 617) to optimize the parameters of the e-beam write process for further wafer exposures (step 619). The overlay marks and metrology structures may be used to monitor and control the e-beam exposures in the further wafer exposures following step 619. An exemplary estimation shows that the additional cycle time required for the write process will be small: with 100 defects on the reticle, each corresponding to an area of $10\mu2$ on the wafer, and 100 exposure fields per wafer, the e-beam write area per wafer is 0.1 mm2, and an estimated write time per wafer is less than one minute. Therefore, using an e-beam writer to correct for reticle defects has low time loss and high flexibility with no requirement for additional reticles. However, it does require a separate tool or chamber, whereas exposure using a correction reticle or a repair kit on a reticle may occur in the same tool and chamber as exposure using the original reticle. Using an e-beam writer also requires that the resist used for the exposure be sensitive to both the actinic radiation of the original exposure and to electrons. Alternatively, a laser beam writer with suitable wave length may be employed instead of an e-beam writer; this would, however, result in a poorer resolution of the correction.

Figure 7A:
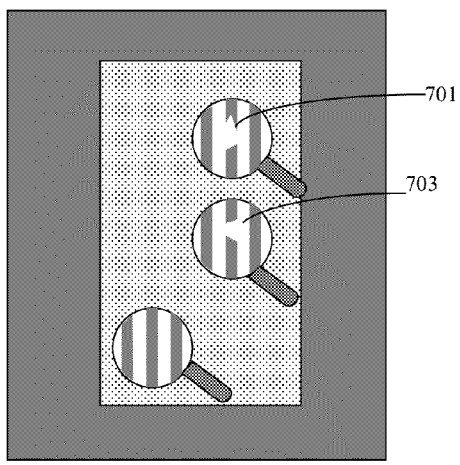
FIGS. 7A and 7B schematically illustrate a reticle with clear defects and the reticle with the clear defects converted to dark defects, in accordance with exemplary embodiments.

FIG. 7A schematically illustrates a reticle including exemplary clear defects 701 and 703. Adverting to FIG. 7B, the clear defects have been converted to dark defects 705 and 707. The defects are corrected by depositing an absorbing material on the clear defects. However, since the defects are so close to the pattern, some region of the reticle surrounding the clear defects is also covered with the absorbing material. Accordingly, correction of the clear defects may cause new dark defects, such as defects 705 and 707.

In the exemplary embodiments described above, it is implied that the reticle defect correction is done by one or more additional exposures of the same resist layer that is exposed using the original reticle pattern. However, the correction may also be done by one or more additional patterning sequences after (or before) the original patterning sequence, in which a patterning sequence includes the steps of resist coating, exposure, resist developing, and etching (or, alternatively, implantation).

Figure 8:
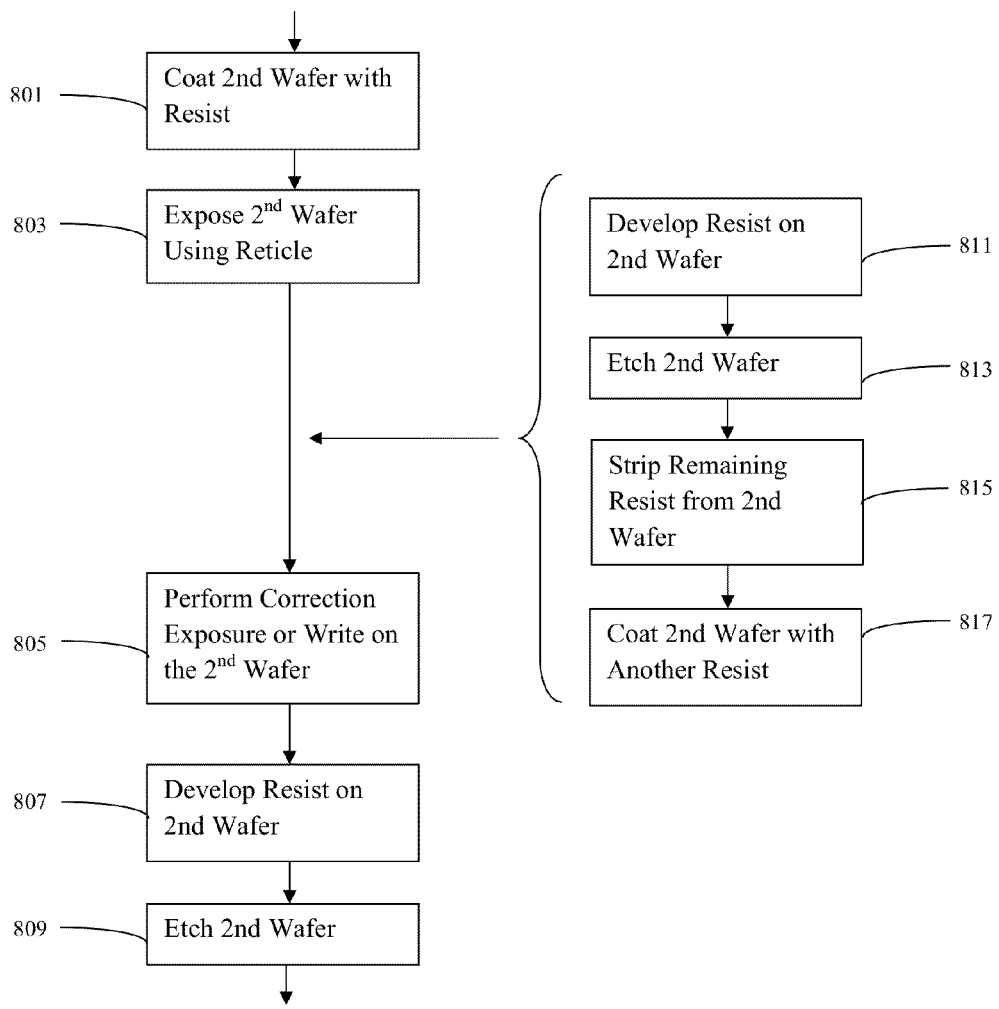
FIG. 8 illustrates an exemplary modification of the process flow for multiple patterning sequences.

FIG. 8 illustrates an exemplary modification of the process flow for multiple patterning sequences (showing only the most important process steps). The sequence on the left hand side of FIG. 8 (steps 801 through 809) illustrates reticle defect correction by additional exposure only, in this case with one additional exposure process after the original exposure. As shown, the wafer is coated with a resist (step 801) before an original exposure (step 803). A correction step 805 is inserted between the original exposure (step 803) and the resist develop process 807. After resist develop, the wafer is etched (step 809). Step 805 is the only additional step compared to the situation with a defect-free reticle. If, however, the correction is done by an additional complete patterning sequence (i.e., by Litho-Etch-Litho-Etch), and not only by an additional exposure step, process steps 811 through 817 will be required between exposure step 803 and correction exposure step 805. Specifically, after the original exposure, resist develop process 811, an etching step 813, stripping of the remaining resist (step 815), and coating of a second resist layer for the second patterning step (step 817) must be additionally inserted into the sequence between steps 803 and 805 as indicated by the horizontal arrow in FIG. 8. Although not shown for illustrative convenience, for a negative tone lithography process (in which the second exposure adds intensity) instead of etching and stripping the resist (steps 813 and 815) before coating a second resist, a freeze process may be performed on the resist after the first exposure, to insure the resist is no longer sensitive to light. Then the method proceeds with second coating step 817.

In the case of several correction exposures, as in the embodiment depicted in FIG. 3, it is again possible to do all correction exposures within one additional patterning sequence (which will be the most practical variant in most cases), or to split them up into several additional patterning sequences. In general, reticle defect correction by separate patterning sequences requires more additional process steps than correction by additional exposures only, but might offer superior control in certain situations. Conceptually, this variant could also be characterized as an automated wafer repair process. However, apart from the greater number of additional process steps, it is included into the wafer production flow in much the same way as the unaccompanied additional exposures described further up. All exemplary embodiments shown in FIGS. 1 through 6 can be converted into correction by separate patterning sequences in much the same way.

Figure 9A:
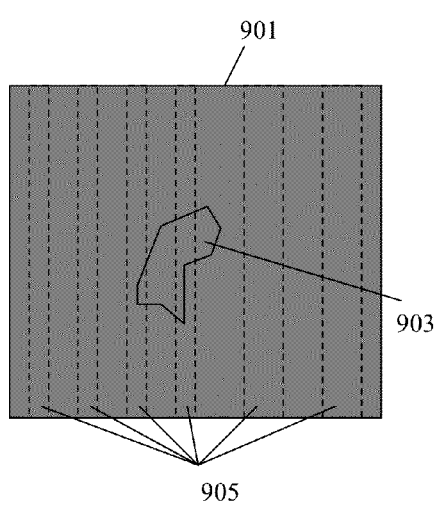
FIG. 9A schematically illustrates a reticle blank with a defect, and FIG. 9B schematically illustrates a reticle made with the blank and a design pattern that is shifted with respect to the blank and modified in an area around the blank defect, in accordance with an exemplary embodiment.
Figure 9B:
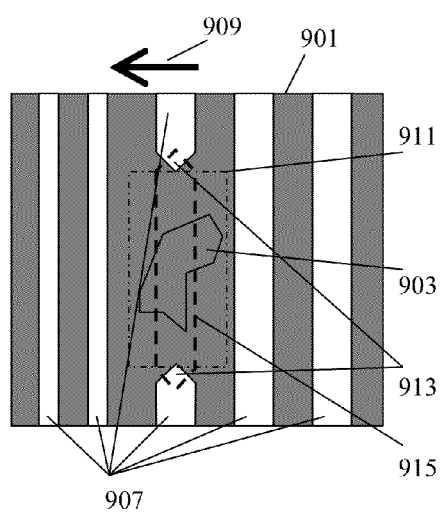

FIGS. 9A and 9B illustrate the preconditioning of a reticle for easier application of a correction exposure for the case where the reticle blank has a defect which is detected before the manufacturing of the reticle. FIG. 9A shows a portion of a reticle blank 901 containing defect 903. The design pattern 905 which is to be created on the reticle is shown by dashed lines. FIG. 9B shows the pattern 907 created in the corresponding portion of the reticle, showing several modifications with respect to the original design 905. First, the design has been shifted with respect to the blank as denoted by translation vector 909, such that the blank defect is now in a less critical region of the design, namely in a region with wider lines and spaces which are less sensitive to small deviations in size (or critical dimension) and overlay. The underlying principle of this method is similar to that of the pre-existing method of addressing EUV blank defects by shifting the design to bring the defects into a design region where they can be tolerated. Since the complete design has to be shifted, all known defects of a given blank must be taken into consideration when determining the most suitable translation vector. Second, an area 911 containing the blank defect but extending beyond its limits is left free of pattern, i.e. dark. Thus, a well-defined dark defect is obtained on the final reticle, instead of a more complicated defect with transition regions at the border that could cause scattering or diffraction effects, which could even make the defect a partially clear defect. Such a defect would be more difficult to correct by a second exposure than the "clean" defect seen in FIG. 9B, or would require an additional repair process (e.g. the application of an absorbing deposit). Third, the points 913 where the pattern will be joined with the repair pattern on the wafer is modified to make the joining less overlay critical, namely by adding a taper at the end of the clear spaces. By providing a similar taper to the correction pattern 915 (shown by the thick dashed line), the resulting pattern on the wafer is made less sensitive to vertical overlay errors between the reticle pattern and the correction pattern than in the case that the corresponding spaces ended in horizontal edges.

Figure 10A:
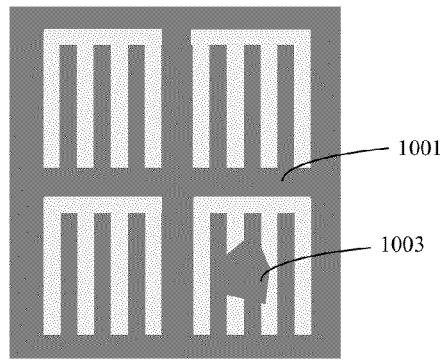
FIG. 10A schematically illustrates a reticle with a defect, FIGS. 10C and 10E schematically illustrate preconditioning around the defect site, and FIGS. 10B, 10D, and 10F schematically illustrate correction reticles for the defect and preconditioned defects of FIGS. 10A, 10C, and 10E, respectively, in accordance with another exemplary embodiment.
Figure 10B:
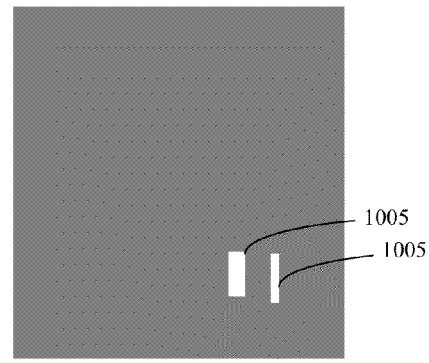

FIGS. 10A through 10F illustrate preconditioning around a defect site, in accordance with another exemplary embodiment. In contrast to FIGS. 9A, 9b, this embodiment addresses the case where a defect is detected after a reticle has been manufactured. FIG. 10A illustrates a portion of a patterned reticle 1001 with a dark defect 1003, similar to the reticle shown in FIG. 1A. Although a single defect is shown for illustrative purposes, the reticle may include multiple defects. If a wafer is exposed using the reticle of FIG. 10A, the portion corresponding to defect 1003 will not be exposed. FIG. 10B illustrates the corresponding portion of a correction reticle, similar to the reticle shown in FIG. 1B. The correction reticle is primarily dark, with a clear pattern corresponding to the location of the defect on the original reticle. Specifically, openings 1005 correspond to portions of defect 1003 that should be clear. Note that the size and shape of the openings can differ from the size and shape of the respective dark defect to obtain the optimum result or to facilitate manufacturing.

Figure 7B:
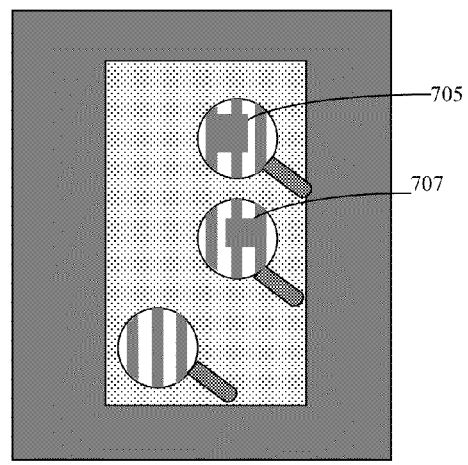
Figure 10C:
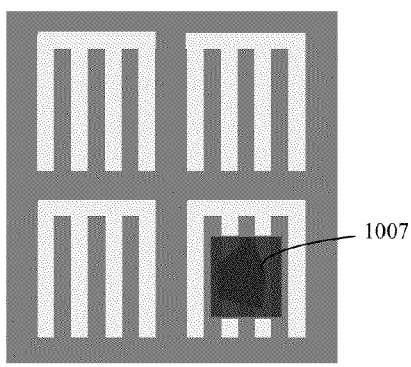
Figure 10D:
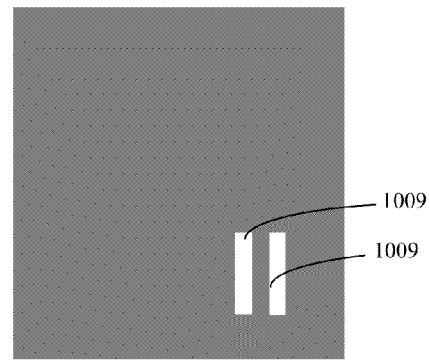

Adverting to FIG. 10C, a larger area 1007 around the defect of FIG. 10A may be made dark, for example by applying an absorbing deposit (similar to the method of turning a clear defect into a dark defect, as illustrated in FIGS. 7A and 7B). The corresponding area on the wafer is then exposed in a second exposure using a correction reticle, such as that shown in FIG. 10D, which is primarily dark, with a clear pattern corresponding to the location of the darkened area 1007 on the modified original reticle. Specifically, openings 1009 correspond to portions of darkened area 1007 that should be clear. The dark area may be chosen in a way to make the second exposure easier in terms of shape and overlay tolerance.

Figure 10E:
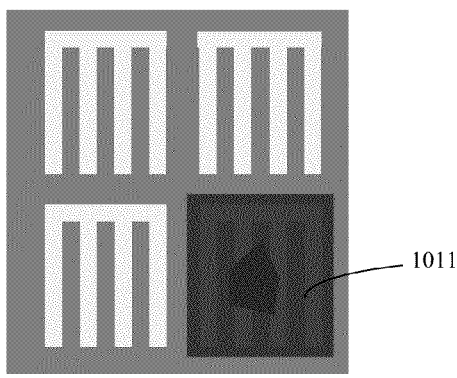
Figure 10F:
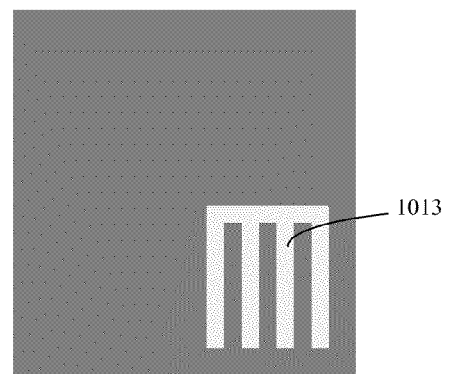

FIG. 10E illustrates a variation of FIG. 10C, in which a larger area 1011 around the defect of FIG. 10A is made dark. Again, the corresponding area on the wafer is then exposed in a second exposure using a correction reticle, in this case shown in FIG. 10F, which is primarily dark, with a clear pattern corresponding the pattern corresponding to the location of the darkened area 1011 on the modified original reticle. Specifically, openings 1013 correspond to portions of darkened area 1011 that should be clear. As with FIG. 10C, the dark area may be chosen in a way to make the second exposure easier in terms of shape and overlay tolerance. A small absorbing deposit as shown in FIG. 10C may facilitate the repair pattern, whereas a large absorbing pattern as shown in FIG. 9E may increase overlay tolerance, e.g. by reducing the number of instances where lines or spaces are joined ("stitched") between the reticle pattern and the correction pattern (in FIGS. 10E, 10F, this number is reduced to zero). Although in FIGS. 10C and 10E the defect site is modified in a repair process subsequent to reticle manufacturing, it is clear that in the case where the defect is caused by a blank defect detected before reticle manufacturing, the same effects can be achieved by leaving the corresponding areas around the defect free of pattern from the beginning, similar to the embodiment shown in FIGS. 9A, 9B.

FIGS. 11A through 11E illustrate various methods of overlapping a correction pattern with a pattern on an original reticle, in accordance with another exemplary embodiment. This applies particularly to a double patterning situation in which two different photoresist layers are exposed with the original reticle and the correction pattern, followed in each case by an etch step (for a Litho-Etch-Litho-Etch process) and possibly further wafer processing steps, in which the etch steps are sufficiently selective to make a double etch not critical. An exemplary embodiment will be shown in FIGS. 12A through 12G. On the other hand, in the simpler double exposure situation, in which the same photoresist on the wafer is exposed with both the original reticle and the correction pattern, an overlap between the two exposures that is larger than a few (e.g. 10) nanometers will have such a significant impact on pattern size or critical dimension (CD) on the wafer that such an overlap may not be acceptable for high-end applications.

Figure 11A:
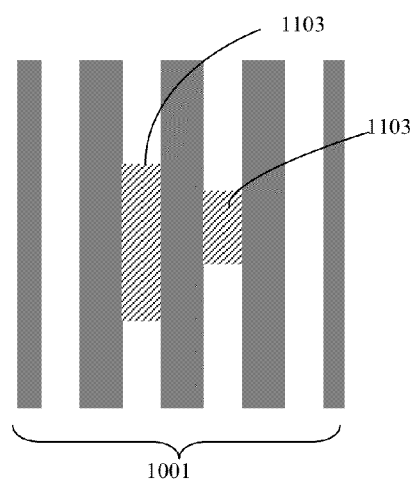
FIG. 11A schematically illustrates a reticle with a defect, and FIGS. 11B through 11E schematically illustrate overlapping correction patterns for the defect of FIG. 11A, in accordance with another exemplary embodiment.
Figure 11B:
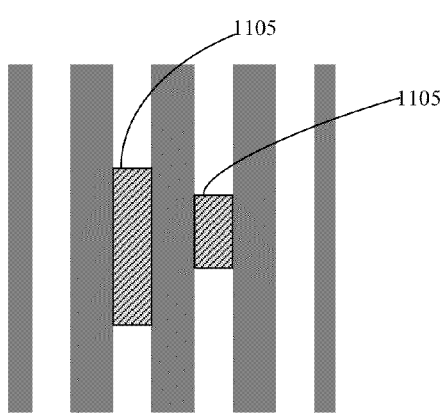

Adverting to FIG. 11A, a reticle portion 1101 is shown with a defect 1103. The defect, though not shown dark as portions of the reticle, is a dark defect. Although a single defect is shown for illustrative purposes, the reticle may include multiple defects. As illustrated in FIG. 11B, a repair pattern 1105 is the same size as defect 1103, with no overlap. Although shown dark (for illustrative convenience), the repair pattern 1105 would actually be clear pattern realized, for example, on a primarily dark correction reticle. The correction pattern of FIG. 11B substantially corresponds to a correction pattern as illustrated in FIG. 1B.

Figure 11C:
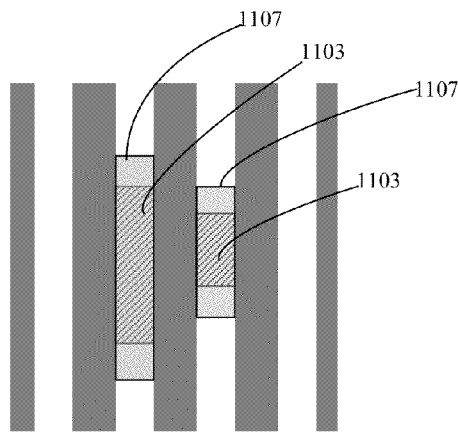
Figure 11D:
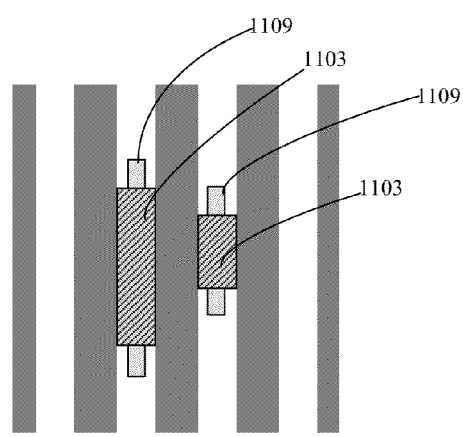

FIG. 11C illustrates a repair pattern 1107 which extends beyond the defect 1103. The correction pattern may be 3 nm to 15 nm larger than the defect (or up to 50 nm larger for a reticle that is not a high-end reticle) so that it overlaps with the undamaged part of the reticle pattern, providing better tolerance to overlay errors between the exposure with the reticle and the exposure with the repair pattern. However, an overlapping repair pattern such as that shown in FIG. 11C only works if the portion of the correction pattern outside the defect may be exposed twice, e.g. if a double patterning approach is used or if the overlapping region is sufficiently small. Adverting to FIG. 11D, a fitted correction pattern 1109 is illustrated. Correction pattern 1109 completely covers the defect and includes a small narrower portion at the top and bottom of each defect. As shown in FIG. 9B (but not in 11D), a corresponding modification of the adjoining region may be applied to the reticle pattern in a preconditioning step, to increase overlay tolerance.

Figure 11E:
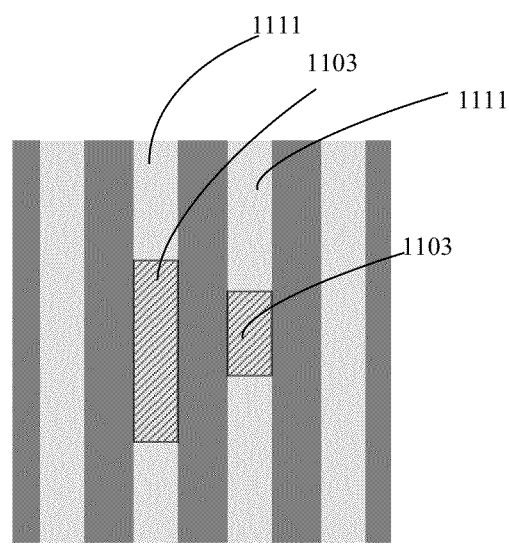

Last, as illustrated in FIG. 11E, the repair pattern 1111 may be a duplicate of the original reticle (assist structures as overlay marks or metrology structures for the measurement of critical dimension or CD may differ between the two patterns). Although in the following it will be assumed that this duplicate pattern is placed on a separate reticle, it may alternatively be placed on the original reticle if there is sufficient space for essentially two copies of the same design pattern. In this embodiment, clear defects would need to be removed from both reticles, and the wafer would be exposed with both reticles by a lithography-etch-lithography-etch process, preferably with separate overlay marks for each reticle. By writing two reticles with identical patterns, there is no concern for designing a correction pattern, thereby simplifying the process. Also, the number of dark defects on both reticles could be very high (e.g. several 100), as the probability of finding defects at corresponding positions on both reticles would still be near zero; thereby, the high quality requirements for e.g. EUV blanks could be significantly relaxed, and the repair effort would be limited to converting clear defects into dark defects. Also, there is an ability to correct for soft and movable defects (such as particles on the reticle), particularly as it is unlikely that defects will appear in the same places on both reticles. Obviously design or OPC weak points or shortcomings cannot be corrected with both reticles having the same pattern. However, such weak points or shortcomings may potentially be corrected in the manufacturing of the second reticle, and the exposure with both reticles may still be applied to dispose of the "real" dark defects in both reticles.

Disadvantages of using two reticles with the same or nearly the same pattern include that overlay errors translate into critical dimension (CD) errors. To mitigate this, the wafer may be slightly underexposed during each exposure. A specific example is given in the following. In this example, it is assumed that the double processing alone has no influence on wafer CD, i.e. it is assumed that with two perfectly identical reticle patterns with perfect overlay and without random CD variations, the resulting CDs on the wafer with two exposures would be the same as with one exposure. Assume further that in the resulting wafer pattern trenches correspond to clear spaces on the reticle; the width of these trenches is defined as critical dimension or CD, while the width of the corresponding clear spaces on the reticle is defined as reticle CD. Denoting $\Delta CD_{max}$ as the maximum absolute (wafer) CD deviation from the target value of a single exposure and $\Delta o_{max}$ as the maximum absolute overlay error between the two exposures with the two reticles, the worst possible positive and negative CD errors on the wafer following exposure with both reticles are $$\Delta CD_{max}^{DP} = \Delta CD_{max} + \Delta o_{max}$$

and $$\Delta CD_{min}^{DP} = -\Delta CD_{max},$$

respectively, without adjustment of the exposure doses, and $$\begin{cases} \Delta CD_{max}^{DP} = \Delta CD_{max} + \dfrac{\Delta o_{max}}{2} \\ \Delta CD_{min}^{DP} = -\Delta CD_{max} - \dfrac{\Delta o_{max}}{2} \end{cases}$$

if the exposure doses of both exposures are reduced such that the average CD values are reduced by $\Delta o_{max}/2$. Assuming a maximum overlay error of $\Delta o_{max} = 4$ nm, which is within the capability of existing wafer exposure tools, an additional maximum CD error of ±2 nm would result, which may be tolerable in many cases. A more detailed analysis of the distribution of CD and overlay errors may result in a different optimum amount of dose reduction. As an alternative to reducing the exposure dose, the reticle CD may be reduced in the manufacturing of one or both reticles, achieving essentially the same effect; with this variant, it is furthermore possible to apply specific amounts of CD reduction to different features in the pattern to achieve optimum compensation of overlay effects. In addition to the impact of non-perfect overlay on wafer CD, this method is not feasible with direct write variants, and it requires an etch process with high selectivity (one which is selective enough that it will essentially not matter if the etching occurs once or twice for any given region of the wafer).

FIGS. 12A through 12G illustrate a more specific case for the embodiment shown in FIG. 11E. Corresponding portions of two reticles 1201 and 1205 with the same design are shown in FIGS. 12A and 12B. The two reticles have dark defects 1203 and 1207, respectively, but at different positions. FIGS. 12C through 12G show a cross section through a wafer processed with both reticles, along a line corresponding to the horizontal line through the middle of the reticle portions shown in FIGS. 12A and 12B, at various stages of wafer processing. The wafer substrate 1209 is covered with a so-called hard mask layer 1211 which is typically 5 to several 10 nm thick. The photoresist is coated onto the wafer on top of the hard mask layer (note that this is a simplified representation compared to most contemporary wafer patterning processes). In FIG. 12C, a first photoresist layer 1213 has been exposed with reticle 1201 and developed, leaving a resist pattern in which a trench is missing at the position corresponding to reticle defect 1203. In FIG. 12D, the resist pattern has been transferred into the hard mask 1211 in an etch process that is selective to the hard mask layer, such that it does not etch into the substrate 1209. Furthermore, the remaining resist has been stripped, leaving pattern 1215 in the hard mask. In FIG. 12E, a second photoresist layer 1217 has been coated onto the structured hard mask, exposed with the second reticle 1205, and developed, leaving a resist pattern in which a trench is missing at the position corresponding to reticle defect 1207. In FIG. 12F, the pattern of the second photoresist layer has been transferred into the hard mask in a second selective etch process, and the remaining resist has been stripped, leaving pattern 1219 in the hard mask. Pattern 1219 corresponds to the originally intended design, and all trenches are equally wide (i.e. have the same CD), regardless of whether they have been exposed to one or two etch processes (perfect overlay between the two exposures is assumed here). Finally, in FIG. 12G, the hard mask pattern has been transferred into substrate 1209 in a different etch process, and the hard mask removed in further hard mask etch step, leaving pattern 1221 in the substrate. Due to the intermediate selective hard mask etch steps, all trenches of pattern 1221 have the same depth and width, regardless of whether the corresponding wafer region has been exposed in one or both exposure steps.

For all embodiments shown in FIGS. 9A, 9B, 10A through 10F, 11A through 11E, and 12A through 12G, the correction pattern can be realized on a separate correction reticle which is then used to expose the same wafer that is also exposed with the original reticle (note that the designations of patterns/reticles as "original" or "correction" is somewhat arbitrary in FIGS. 11E, 12A, and 12B). Assist structures, as alignment marks, metrology, or overlay marks, will usually also be included in the correction reticle. Alternatively, the correction pattern (or potentially several separate correction patterns for several defects) may be added to the original reticle, if there is sufficient space on the original reticle; however, except for the scenarios illustrated in 11E, 12A, and 12B, this would require a second patterning sequence of the original reticle after the characterization of the defects of the original reticle pattern. For the embodiments of FIGS. 9A, 9B, 10A through 10F, and 11A through 11D, although the correction exposure may be done in the same chamber and with the same tool as the original exposure (e.g., an EUV tool), the correction exposure may take place in a less advanced tool, for example, a conventional exposure tool, and may employ a different type of actinic radiation, e.g. conventional UV light, rather than using EUV in an EUV tool; in this case, the (separate) correction reticle would be a conventional reticle, too. Use of a less advanced tool has the advantage of reducing costs, whereas an EUV tool has superior resolution. Further, the second exposure may alternatively be performed prior to the first exposure. As a further variation, a programmable e-beam or laser writer, as illustrated in FIG. 5, may be employed for writing the repair pattern on the resist covered wafer, with a process flow substantially as illustrated and described with respect to FIG. 6. This is not a reasonable option for the embodiments shown in FIGS. 11E and 12A through 12G, since a direct write of the whole pattern would require an unacceptable amount of time and render the additional exposure with a reticle pointless.

In addition, for the embodiments of FIGS. 9A, 9B, 10A through 10F, and 11A through 11D, instead of obtaining a tailor made correction pattern on a separate correction reticle or the original reticle, a pre-defined repair kit may be included in the margins of the original reticle, as illustrated in FIG. 3. The repair patterns may be small standard clear polygons well separated from each other and from the main image fields. For each dark defect in the original design, the most appropriate repair pattern is selected, and an additional exposure is applied to the wafer. Doses of additional exposures are optimized for the best repair results, and scanner REMA blades are employed for narrowing the fields of additional exposures to selected repair patterns. In another variant, the repair kit on the original reticle may alternatively be tailor-made to correspond to the actual defects, and therefore be optimized for the actual defects. However, a second patterning step of the reticle would be required. In still another variant, a larger and more variable repair kit may be put on a separate reticle, potentially serving as a universal repair reticle for several production reticles. As in the exemplary embodiments described with reference to FIGS. 1 through 4, assist structures, as alignment marks, overlay marks, and metrology structures, may be added to the correction pattern or repair kit (especially if the correction pattern or repair kit is placed on a separate reticle), and corresponding structures may be added to the original design.

As described above, weak spots may also be present in the design or be caused by OPC and may have the same effect as reticle defects. Besides, shortcomings in the design, or the need for design modifications, as, for example, additional contacts, may become apparent after manufacturing of the reticle. Such detected weak spots, or any subsequent design modification, generally require a design re-spin and the writing of a replacement reticle both of which are costly and time consuming. Instead, the above described methods could be employed to correct such weak spots or shortcomings in the design. Other exemplary cases of subsequent design modifications (i.e. correction of design shortcomings) by a second (correction) exposure, besides the creation of additional contacts, include connection or disconnection of lines, and the addition of dummy fill pattern that had accidentally been left out of the original pattern in empty areas of the original pattern (dummy fill pattern has no electrical functionality, but may be needed for the homogeneity of wafer processing steps as e.g. etching or polishing).

In the preceding illustrations, exemplary embodiments for the correction of dark reticle defects were described. In the most basic embodiments of this disclosure, these are the only defects that can be corrected, as a second exposure can only add illumination to, but not remove illumination from, a wafer. However, at least in principle, embodiments can be envisaged in which clear, not dark, reticle defects are corrected by a second exposure. Such embodiments necessarily follow the double patterning approach, i.e. the exposure with the original reticle and the exposure with the correction pattern must be applied to different photoresist layers, with additional wafer processing steps (as etch or implantation, resist develop, strip, and coat steps) in between.

One exemplary embodiment of a double patterning process that can be used for the correction of clear defects is illustrated in FIGS. 13A through 13G. In this illustration, the photoresist is coated directly onto a wafer substrate 1301 in a simplified representation of a wafer patterning process. In FIG. 13A, a first photoresist layer 1303 is exposed in a first exposure 1305 which will also be denoted by the letter A in the following. This first exposure may be performed with an original reticle (not shown) having clear defects. The photoresist is then developed, leading to resist pattern 1307, shown in FIG. 13B. In a so-called freeze step (which may involve chemical, thermal, or radiation treatment), this resist pattern is made insensitive to the following second lithographic sequence. The "frozen" resist pattern 1309 is shown in FIG. 13C. As shown in FIG. 13D, a second photoresist layer 1311 is then coated over the hardened resist pattern and exposed in a second exposure denoted 1313 or B. This second exposure may be performed with a correction pattern for the clear defects of exposure A, or alternatively, B may be the exposure with the original reticle and A the correction exposure. After development of the exposed resist 1313, additional resist structures 1315 remain on the substrate as shown in FIG. 13E. In FIG. 13F, the combined resist pattern of both exposures has been transferred into the substrate in an etch process, leading to pattern 1317 in the substrate, and in FIG. 13G, the resist has been stripped off the patterned substrate.

More generally, a double patterning process based on two separate exposures can be characterized by a Boolean formula $p=OR(b_A(A), b_B(B))$, in which A and B indicate whether an area of the wafer is illuminated in one or the other exposure, respectively, and can accordingly assume the values TRUE or FALSE. It is left open in which order the exposures A and B are applied. OR is the Boolean "or" function (also denoted by the operator symbol v), and $b_A$ and $b_B$ are potentially different Boolean operators that can either be the negation operator NOT ($\neg$) or the identity operator, which will be denoted IS in the following (IS=NOT NOT). p denotes the (binary) state of an area on the wafer after completion of the double patterning process, e.g. etched or not etched, doped or not doped, etc., and can also have the values TRUE or FALSE. Note that the definition of p does not have to conform to the usual convention of what is called "pattern" in a chip layer (usually the regions that will carry current are called "pattern" and the isolating regions "non pattern" regardless of the details of the patterning process).

For example, the double patterning process shown in FIG. 13A through 13G corresponds to $b_A=b_B=NOT$, with p=TRUE indicating non-etched regions (1317 in FIG. 13G). On the other hand, the Litho-Etch-Litho-Etch process shown in FIG. 12A through 12G corresponds to $b_A=b_B=IS$, with p=TRUE indicating the etched regions (1221 in FIG. 12G). Note that the lithographic processes shown in both 12A through 12G and 13A through 13G are so-called positive tone processes, in which the illuminated part of the resist is removed during developing (this is the more common case). If any lithographic process in the two illustrated embodiments were replaced by a negative tone process in which the non-illuminated part of the resist is removed, the corresponding Boolean operator $b_A$ or $b_B$ would be inverted (NOT→IS or IS→NOT, respectively). In contrast to this, a double exposure process in which the same resist is exposed in two separate exposures before further processing is characterized by $b_A=b_B=IS$ regardless of the polarity of the lithographic process.

Referring again to the correction of reticle defects, and assuming that A denotes the exposure with the original reticle, the method of correction by a second exposure according to this disclosure allows the correction of dark reticle defects if $b_A=IS$ in the characterizing formula of the complete patterning process of the respective layer, and the correction of clear reticle defects if $b_A=NOT$. Accordingly, all methods demonstrated for the correction of dark reticle defects in the exemplary embodiments throughout this disclosure can equally be applied to the correction of clear reticle defects if the characterizing formula of the applied double patterning process contains the operator $b_A=NOT$. In this case, the application of an absorbing deposit to convert a clear defect into a dark defect or to enlarge a dark defect must be replaced by a corresponding repair process that locally enhances the clear area of the reticle (e.g. a local etch of the absorbing reticle layer); however, it may not be possible to change the nature of a dark defect that is caused by a defect in the reflective multilayer stack of an EUV reticle. Also, the preconditioning of the reticle during manufacturing that consists of leaving intact the absorbing layer around a blank defect site must be replaced by the total removal of the absorbing layer in this area. With respect to embodiments containing exposures with two patterns each containing the complete chip design (see for example FIG. 11E), the reduction of the exposure dose or clear space reticle CD to reduce wafer CD errors caused by overlay mismatch must be replaced by a corresponding increase of the dose or the clear space reticle CD, respectively, if the corresponding Boolean operator $b_A$ or $b_B$ is NOT instead of IS. If more than one correction exposure is applied to the wafer for the correction of more than one defect, the complete wafer patterning process becomes a multi-exposure/multi-patterning process; in this case, the characterizing Boolean formula has to be expanded by adding more arguments $b_C(C), b_D(D)$, etc. to the OR function, while the rest of the argumentation remains the same. With all this said, it should be mentioned that for applications of this disclosure, cases with $b_A=IS$ and the correction of dark reticle defects are expected to be more numerous than cases with $b_A=NOT$ and the correction of clear reticle defects. Reasons for this expectation are that the condition $b_A=IS$ applies to double exposure of the same photoresist as well as to Litho-Etch-Litho-Etch processes (which are more common than Litho-Freeze-Litho- . . . processes) with a positive tone lithography process A. Also, dark reticle defects generally occur more often than clear defects.

The embodiments of the present disclosure can achieve several technical effects, such as reticle defect correction at relatively low cost, by using a cheaper second reticle or repair pattern or by using a programmable e-beam or laser beam for a second exposure, without adding significant time to the setup time. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices, particularly for EUV technologies below 20 nm as well as for 28 nm and other smaller node technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
obtaining a reticle with a pattern corresponding to a design for a wafer pattern; exposing a wafer with the reticle;
modifying the design for the wafer pattern;
identifying variations between the design for the wafer pattern and the modified design for the wafer pattern;
designating the variations as defects in the reticle; and
exposing the wafer with one or more correction patterns, the correction patterns containing structure corresponding to the modified design for the wafer pattern at positions, on the wafer, corresponding to positions of the defects.

2. The method according to claim 1, wherein the modified design comprises contacts not in the design.

3. The method according to claim 1, wherein the modified design comprises connections or disconnections of lines not in the design.

4. The method according to claim 1, wherein the modified design comprises dummy fill pattern not in the design.

5. The method according to claim 1, comprising exposing the wafer with a correction pattern by exposing the wafer with an area of a correction reticle consisting essentially of the correction pattern or a part of a repair kit being on a second reticle or an area of the reticle containing a correction pattern or a part of a repair kit on the reticle, the area containing the correction pattern or the repair kit being outside an area containing the pattern.

6. The method according to claim 1, comprising exposing wafer with a correction pattern by exposing the wafer with an e-beam or laser writer programmed with a pattern consisting essentially of the correction pattern.

7. The method according to claim 1, wherein the reticle is an EUV reticle.

8. A method comprising:
detecting a defect in a reticle blank;
patterning the reticle blank with a pattern corresponding to a design for a wafer pattern, shifting the design pattern with respect to the blank defect and/or leaving free of pattern an area of the reticle blank corresponding to the defect and/or modifying the pattern with respect to the design at one or more positions near a position of the defect;
exposing a wafer with the patterned reticle blank; and
exposing the wafer with a correction pattern, by exposing the wafer with an e-beam or laser writer programmed with a pattern consisting essentially of the correction pattern, containing structure corresponding to the design at a position, on the wafer, corresponding to the position of the defect.

9. The method according to claim 8, comprising leaving free of pattern the area of the reticle blank corresponding to the defect by omitting, during patterning the reticle blank, a portion of the pattern corresponding to a location of the defect.

10. The method according to claim 8, comprising exposing the wafer with a correction pattern by exposing the wafer with an area of a correction reticle consisting essentially of the correction pattern or a part of a repair kit being on a second reticle or an area of the reticle containing a correction pattern or a part of a repair kit on the reticle, the area containing the correction pattern or the repair kit being outside an area containing the pattern.

11. The method according to claim 8, wherein the reticle blank is an EUV reticle blank.

12. A method comprising:
obtaining a reticle with a pattern corresponding to a design for a wafer pattern; detecting a defect, weak spot, or shortcoming on the reticle;
exposing a wafer with the reticle; and
exposing the wafer with a correction pattern for the defect, weak spot, or shortcoming, the correction pattern being larger than the defect, weak spot, or shortcoming;
wherein the correction pattern comprises a second pattern corresponding to the design for a wafer pattern or a pattern corresponding to the design for a wafer pattern with one or more modifications.

13. The method according to claim 12, wherein the correction pattern is 3 nanometers (nm) to 50 nm larger than the defect, weak spot, or shortcoming.

14. The method according to claim 12, wherein the correction pattern comprises an extended portion, the extended portion being narrower than the design pattern at the position corresponding to the extended portion.

15. The method according to claim 12, further comprising modifying a dose of the exposure with the reticle and/or a dose of the exposure with the correction pattern and/or one or more sizes of parts of the pattern on the reticle during manufacturing of the reticle and/or one or more sizes of parts of the correction pattern to achieve, for an exposure with only the reticle or only the correction pattern, a mean pattern size on the wafer or critical dimension that differs from the target pattern size on the wafer to compensate for overlay errors between the exposure with the reticle and the exposure with the correction pattern.

16. A method comprising:
obtaining a reticle with a pattern corresponding to a design for a wafer pattern;
detecting one or more defects, weak spots, or shortcomings on the reticle;
modifying none, one, or more of the defects, weak spots, or shortcomings on the reticle;
identifying the defects, weak spots, or shortcomings as clear or dark;
exposing a wafer covered with a photoresist with the reticle;
exposing the wafer covered with one or more different photoresists, before and/or after the exposure with the reticle, with one or more correction patterns for one or more of (i) the dark or (ii) the clear defects, weak spots, or shortcomings;
applying one or more further processing steps to the wafer before, between, and/or after the exposure with the reticle and the exposure or exposures with the correction pattern or patterns, the processing sequence comprised of the exposures with the reticle and the correction pattern or patterns and the one or more further processing steps corresponding to a double patterning or multi-patterning process characterized by a Boolean formula containing (i) "OR(A" for dark defects or (ii) "OR(NOT (A)" for clear defects, in which A denotes the illumination of the wafer in the exposure with the reticle.

* * * * *